(12) United States Patent
Ha et al.

(10) Patent No.: US 10,629,624 B2
(45) Date of Patent: Apr. 21, 2020

(54) THIN FILM TRANSISTOR ARRAY PANEL

(71) Applicants: SAMSUNG DISPLAY CO., LTD., Yongin-si, Gyeonggi-Do (KR); Seoul National University R&DB Foundation, Seoul (KR)

(72) Inventors: Jae Heung Ha, Suwon-si (KR); Jong Woo Kim, Gwangmyeong-si (KR); Ji Young Moon, Gwangju-si (KR); Min Ho Oh, Suwon-si (KR); Seung Jae Lee, Seoul (KR); Yoon Hyeung Cho, Yongin-si (KR); Young Cheol Joo, Hwaseong-si (KR); Hyeong Joon Kim, Seoul (KR); Eun-Kil Park, Seoul (KR); Sang Jin Han, Seoul (KR)

(73) Assignees: SAMSUNG DISPLAY CO., LTD., Yongin-si, Gyeonggi-Do (KR); SEOUL NATIONAL UNIVERSITY R&DB FOUNDATION, Seoul (KR)

(*) Notice: Subject to any disclaimer, the term of this patent is extended or adjusted under 35 U.S.C. 154(b) by 0 days.

(21) Appl. No.: 15/678,503

(22) Filed: Aug. 16, 2017

(65) Prior Publication Data

US 2018/0061865 A1    Mar. 1, 2018

(30) Foreign Application Priority Data

Aug. 23, 2016  (KR) .................. 10-2016-0107242

(51) Int. Cl.
*H01L 27/12* (2006.01)
*H01L 29/49* (2006.01)
*H01L 29/786* (2006.01)

(52) U.S. Cl.
CPC ...... *H01L 27/1225* (2013.01); *H01L 29/4908* (2013.01); *H01L 29/7869* (2013.01)

(58) Field of Classification Search
CPC .......... H01L 21/31629; H01L 27/1251; H01L 27/1222–1225; H01L 29/786; H01L 29/7866–78678; H01L 29/4908; H01L 29/7869–78693; H01L 51/0541
See application file for complete search history.

(56) References Cited

U.S. PATENT DOCUMENTS 8,389,991 B2 * 3/2013 Morosawa .......... H01L 29/4908
257/43
8,420,456 B2 * 4/2013 Okamoto ............ H01L 29/4908
257/347

(Continued)

FOREIGN PATENT DOCUMENTS

KR   10-2015-0053994      5/2015
KR   10-2015-0111438     10/2015
(Continued)

*Primary Examiner* — Jose R Diaz
(74) *Attorney, Agent, or Firm* — F. Chau & Associates, LLC

(57) ABSTRACT

A thin film transistor array panel includes a substrate, a gate insulating layer, an interface layer, and a semiconductor layer. The gate insulating layer is disposed on the substrate. The interface layer is disposed on the gate insulating layer. The semiconductor layer is disposed on the interface layer. The interface layer includes a fluorinated silicon oxide. The semiconductor layer includes a p-type oxide semiconductor material.

13 Claims, 7 Drawing Sheets

(56) References Cited

U.S. PATENT DOCUMENTS

| | | | | |
|---|---|---|---|---|
| 8,901,556 | B2* | 12/2014 | Okazaki | H01L 29/66742 |
| | | | | 257/43 |
| 9,455,324 | B2* | 9/2016 | Cao | G02F 1/1368 |
| 2009/0184315 | A1* | 7/2009 | Lee | H01L 27/1296 |
| | | | | 257/43 |
| 2013/0048994 | A1* | 2/2013 | Choi | H01L 29/458 |
| | | | | 257/59 |
| 2015/0144951 | A1* | 5/2015 | Kim | H01L 21/02164 |
| | | | | 257/72 |
| 2015/0249159 | A1 | 9/2015 | Tao et al. | |
| 2015/0380561 | A1 | 12/2015 | Won et al. | |

FOREIGN PATENT DOCUMENTS

| | | |
|---|---|---|
| KR | 10-2015-0127122 | 11/2015 |
| KR | 10-1603768 | 3/2016 |
| WO | 2014/133722 | 9/2014 |

* cited by examiner

THIN FILM TRANSISTOR ARRAY PANEL

CROSS-REFERENCE TO RELATED APPLICATION

This application claims priority under 35 U.S.C. § 119 to Korean Patent Application No. 10-2016-0107242 filed in the Korean Intellectual Property Office on Aug. 23, 2016 the disclosure of which is incorporated by reference herein in its entirety.

TECHNICAL FIELD

Exemplary embodiments of the present invention relate to an array panel, and more particularly to a thin film transistor array panel.

DISCUSSION OF RELATED ART

A thin film transistor (TFT) may be used in various types of electronic devices, such as a display device. For example, the thin film transistor may be used as a switching element or a driving element in a display device. The display device may be a liquid crystal display (LCD) or an organic light-emitting diode (OLED) display.

The thin film transistor may include a gate electrode, a source electrode, a drain electrode, and a semiconductor. The drain electrode may face the source electrode. The semiconductor may form a channel to electrically connect the source electrode and the drain electrode.

The semiconductor may include silicon (Si). The silicon may be amorphous silicon or polysilicon, which may be in a crystal form. The amorphous silicon may provide a relatively low mobility of charges and a relatively simple manufacturing process. Thus, amorphous silicon may not be a good choice for high-performance thin film transistors. Mobility of charges of polysilicon is relatively high, but manufacturing using polysilicon requires more processes including crystallizing silicon.

A thin film transistor using an oxide semiconductor with a higher carrier mobility and ON/OFF ratio than the amorphous silicon, and lower cost and higher uniformity than polycrystalline silicon.

SUMMARY

Exemplary embodiments of the present invention provide a thin film transistor array panel. The thin film transistor maintains a transistor characteristic and reduces power consumption, for example, by lowering a threshold voltage while using a p-type oxide semiconductor material as a semiconductor layer.

One or more exemplary embodiments of the present invention provide a thin film transistor array panel. The thin film transistor array panel includes a substrate, a gate insulating layer, an interface layer, and a semiconductor layer. The gate insulating layer is disposed on the substrate. The interface layer is disposed on the gate insulating layer. The semiconductor layer is disposed on the interface layer. The interface layer includes a fluorinated silicon oxide. The semiconductor layer includes a p-type oxide semiconductor material.

The p-type oxide semiconductor material may include a tin oxide or a copper oxide.

The gate insulating layer may include a silicon oxide or a silicon nitride.

A thickness of the interface layer may be in a range of about 0.1 nm to about 20 nm.

The semiconductor layer may include a tin oxide. A threshold voltage of a thin film transistor of the thin film transistor array panel may be about 3 V or less.

The semiconductor layer may include a tin oxide. A sub-threshold swing value of a thin film transistor of the thin film transistor array panel may be about 6 V/dec or less.

The thin film transistor array panel may further include a gate electrode. The gate electrode may be disposed between the substrate and the gate insulating layer.

The thin film transistor array panel may include a source electrode and a drain electrode. The source electrode and the drain electrode may be disposed on the semiconductor layer.

The thin film transistor array panel may further include a pixel electrode. The pixel electrode may be connected to the drain electrode.

The interface layer may be disposed on a partial region of the gate insulating layer.

One or more exemplary embodiments of the present invention provide a thin film transistor array panel. The thin film transistor array panel includes a substrate, a semiconductor layer, an interface layer, and a gate insulating layer. The semiconductor layer is disposed on the substrate. The interface layer is disposed on the semiconductor layer. The gate insulating layer is disposed on the interface layer. The interface layer includes a fluorinated silicon oxide. The semiconductor layer includes a p-type oxide semiconductor material.

The p-type oxide semiconductor material may include a tin oxide or a copper oxide.

The gate insulating layer may include a silicon oxide or a silicon nitride.

A thickness of the interface layer may be in the range of about 0.1 nm to about 20 nm.

The semiconductor layer may include a tin oxide. A threshold voltage of a thin film transistor of the thin film transistor array panel may be about 3 V or less.

The semiconductor layer may include a tin oxide. A sub-threshold swing value of a thin film transistor of the thin film transistor array panel may be about 6 V/dec or less.

The thin film transistor array panel may further include a gate electrode. The gate electrode may be disposed on the gate insulating layer.

The thin film transistor array panel may further include an insulating layer. The insulating layer may be disposed on the gate electrode.

The thin film transistor array panel may further include a source electrode and a drain electrode. The source electrode and the drain electrode may be disposed on the insulating layer.

The interface layer may be disposed below a partial region of the gate insulating layer.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION OF THE EMBODIMENTS

Figure 1:
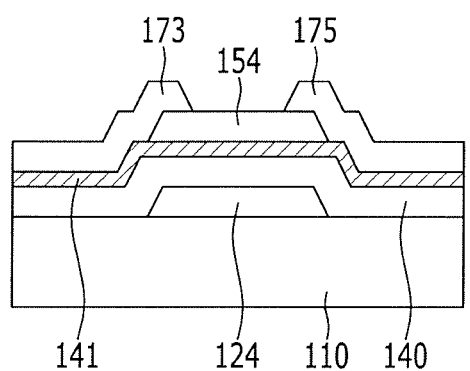
FIG. 1 is a cross-sectional view schematically illustrating a thin film transistor of a thin film transistor array panel according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein. Like reference numerals may refer to like elements throughout the specification and drawings.

It will be understood that although the terms "first" and "second" may be used herein to describe various components, these components should not be limited to these terms.

Sizes of elements in the drawings may be exaggerated for clarity of description.

It will be understood that when a component, such as a layer, a film, a region, or a plate, is referred to as being "on" another component, the component can be directly on the other component or intervening components may be present.

It is to be understood that while parameters may be described herein as having "about" a certain value, according to exemplary embodiments, the parameter may be exactly the certain value or approximately the certain value as would be understood by a person having ordinary skill in the art.

A thin film transistor array panel according to an exemplary embodiment of the present invention will be described with reference to the accompanying drawings.

FIG. 1 is a cross-sectional view schematically illustrating a thin film transistor of a thin film transistor array panel according to an exemplary embodiment of the present invention.

Referring to FIG. 1, a thin film transistor of a thin film transistor array panel may include a gate electrode 124, an insulation substrate 110, a gate insulating layer 140, an interface layer 141, a semiconductor layer 154, a source electrode 173, and a drain electrode 175. The gate electrode 124 may be disposed on the insulation substrate 110. The gate electrode 124 may include at least one of aluminum, silver, copper, molybdenum, chromium, tantalum, or titanium. However, the gate electrode 124 is not limited thereto and may include various metals or conductors.

The gate insulating layer 140 may be disposed on the gate electrode 124. The gate insulating layer 140 may include an insulating material. The gate insulating layer 140 may include a silicon oxide ($SiO_x$) or a silicon nitride ($SiN_x$).

The interface layer 141 may be disposed on the gate insulating layer 140. The interface layer 141 may include a fluorinated silicon oxide (SiOx:F). The interface layer 141 may have a thickness from about 0.1 nm to about 20 nm.

When the gate insulating layer 140 includes a silicon oxide, the interface layer 141 may be formed by treating a part of the gate insulating layer 140 with a fluorine-containing plasma. Thus, if the surface of the gate insulating layer 140 is treated with the fluorine-containing plasma, part of the gate insulating layer 140 may become the interface layer 141.

The semiconductor layer 154 may be disposed on the interface layer 141. The semiconductor layer 154 may include a p-type oxide semiconductor material. The semiconductor layer 154 may include a tin oxide ($SnO_m$) or a copper oxide ($CuO_n$).

The source electrode 173 and the drain electrode 175 may each be disposed on the semiconductor layer 154. The source electrode 173 and the drain electrode 175 may each include a conductive material such as molybdenum, chromium, tantalum, titanium, copper, or alloys thereof.

Referring to FIG. 1, in the thin film transistor according to an exemplary embodiment of the present invention, the semiconductor layer 154 may include the p-type oxide semiconductor material, and the interface layer 141 may include the fluorinated silicon oxide. The interface layer 141 may be disposed between the semiconductor layer 154 and the gate insulating layer 140.

The metal oxide semiconductor may have a metal ion disposed between an oxygen vacancy and a lattice, which may be an electron donor. The lattice may be an intrinsic defect in a metal oxide. As a result, the metal oxide semiconductor may have an n-type conductive characteristic. Although some metal oxides exhibit a p-type conductivity characteristic, the p-type metal oxide semiconductor may have a relatively low $I_{ON}/I_{OFF}$ value. Thus, it may be relatively difficult to be used as a stably driven thin film transistor. The p-type metal oxide semiconductor may have a relatively high threshold voltage. As a result, power consumption may increase when the p-type metal oxide semiconductor is used.

In the thin film transistor and the thin film transistor array panel according to an exemplary embodiment of the present invention, the interface layer 141 including the fluorinated silicon oxide may be disposed between the semiconductor layer 154 and the gate insulating layer 140. Since the gate insulating layer 140 and the p-type oxide semiconductor layer 154 might not be in direct contact with each other, the interface layer 141 may decrease the threshold voltage of the thin film transistor and may increase an efficiency of the thin film transistor.

The interface layer 141 including the fluorinated silicon oxide may reduce or prevent a trap site of an excess charge generated in the semiconductor layer 154. Fluorine (F) has a relatively strong electronegativity. Thus, a positive ion bonding characteristic may appear. Accordingly, a fluorine (F) element may be bonded to a dangling bond of a bottom surface of the semiconductor layer 154. As a result, a probability of a defect may be reduced. The dangling bond as a joiner of the element (the metal or oxygen) that is not involved to the bonding may act like the defect. As the number of dangling bonds decreases, the trap site generation of the excess charge is suppressed, and accordingly, the characteristic of the thin film transistor including the p-type oxide semiconductor is increased.

The thin film transistor array panel including the thin film transistor according to an exemplary embodiment of the present invention will be described in more detail below with reference to accompanying drawings.

Figure 2:
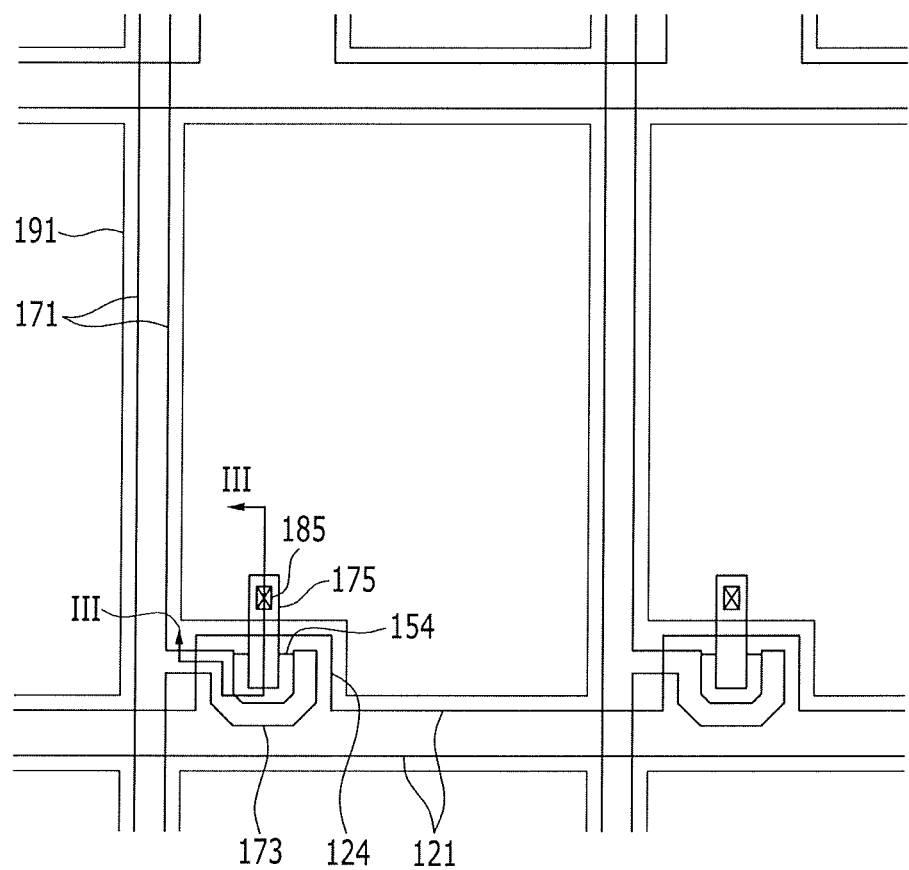
FIG. 2 is a top plan view illustrating a pixel of a thin film transistor array panel according to an exemplary embodiment of the present invention.
Figure 3:
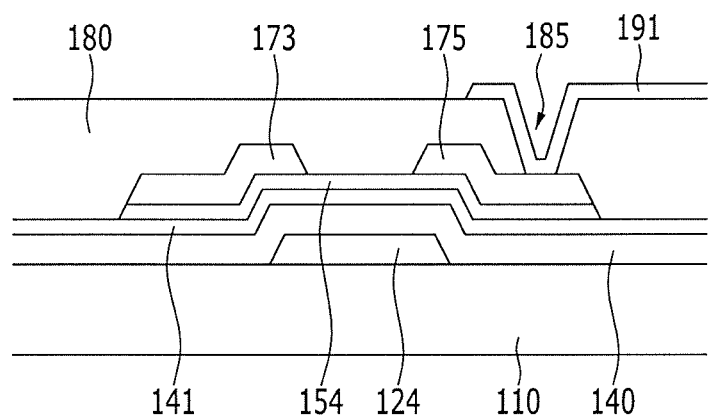
FIG. 3 is a cross-sectional view taken along a line of FIG. 2 according to an exemplary embodiment of the present invention.

FIG. 2 is a top plan view illustrating a pixel of a thin film transistor array panel according to an exemplary embodiment of the present invention. FIG. 3 is a cross-sectional view taken along a line of FIG. 2 according to an exemplary embodiment of the present invention.

Referring to FIGS. 2 and 3, a gate conductor may be disposed on the insulation substrate 110. The gate conductor may include a gate line 121 and the gate electrode 124. The insulation substrate 110 may include a transparent glass or plastic. The gate conductor may include at least one of aluminum, silver, copper, molybdenum, chromium, tantalum, titanium, or alloys thereof. However, the gate conductor is not limited thereto and may include various metals or conductors. The gate conductor may have a multi-layered structure.

The gate line 121 may extend in a first direction. A part of the gate line 121 may become the gate electrode 124.

The gate insulating layer 140 may be disposed on the gate conductor. For example, the gate insulating layer 140 may be disposed on the gate electrode 124. The gate insulating layer 140 may include an insulating material. The gate insulating layer 140 may include a silicon oxide or a silicon nitride.

The interface layer 141 may be disposed on the gate insulating layer 140. The thickness of the interface layer 141 may be in the range of about 0.1 nm to about 20 nm. The interface layer 141 may include the fluorinated silicon oxide.

The semiconductor layer 154 may be disposed on the interface layer 141. The semiconductor layer 154 may include the p-type oxide semiconductor. The semiconductor layer 154 may include a tin oxide or a copper oxide. When the semiconductor layer 154 includes the p-type oxide semiconductor, a carrier in the semiconductor layer 154 may be a hole.

A data line 171, the source electrode 173, and the drain electrode 175 may each be disposed on the semiconductor layer 154 and the interface layer 141. The source electrode 173 may be connected to the data line 171. The drain electrode 175 may face the source electrode.

The data line 171 may transmit a data signal. The data line 171 may extend in a second direction. Thus, the data line 171 may cross the gate line 121.

The gate electrode 124, the source electrode 173, the drain electrode 175, and the semiconductor layer 154 may form a thin film transistor (TFT). A channel of the thin film transistor may be formed in the semiconductor layer 154. The channel pay me disposed between the source electrode 173 and the drain electrode 175.

A passivation layer 180 may be disposed on each of the data line 171, the drain electrode 175, and an exposed part of the semiconductor layer 154. The passivation layer 180 may include an inorganic insulator, an organic insulator, or a relatively low dielectric insulating material. The inorganic insulator may include a silicon nitride or a silicon oxide.

The passivation layer 180 may have a contact hole 185. The contact hole 185 may overlap a part of the drain electrode 175.

A pixel electrode 191 may be disposed on the passivation layer 180. The pixel electrode 191 may include a transparent conductive material such as indium tin oxide or indium zinc oxide. Alternatively, the pixel electrode 191 may include a reflective metal such as aluminum, silver, or alloys thereof. A part of the pixel electrode 191 may be connected to the drain electrode 175. For example, the part of the pixel electrode 191 may be physically and electrically connected to the drain electrode 175.

According to an exemplary embodiment of the present invention, the interface layer 141 including the fluorinated silicon oxide may be disposed between the semiconductor layer 154 including the p-type oxide semiconductor and the gate insulating layer 140. Fluorine included in the interface layer 141 may increase the bonding force between molecules. As a result, the number of dangling bonds of the semiconductor layer may be reduced. Accordingly, the thin film transistor including the p-type oxide semiconductor may perform at a higher rate.

The thin film transistor array panel may have a bottom gate structure. In the bottom gate structure, the gate electrode 124 may be disposed below the semiconductor layer 154. However, exemplary embodiments of the present invention are not limited thereto, and the thin film transistor array panel may have a top gate structure. In the top gate structure, the gate electrode 124 may be disposed on the semiconductor layer 154.

Figure 4:
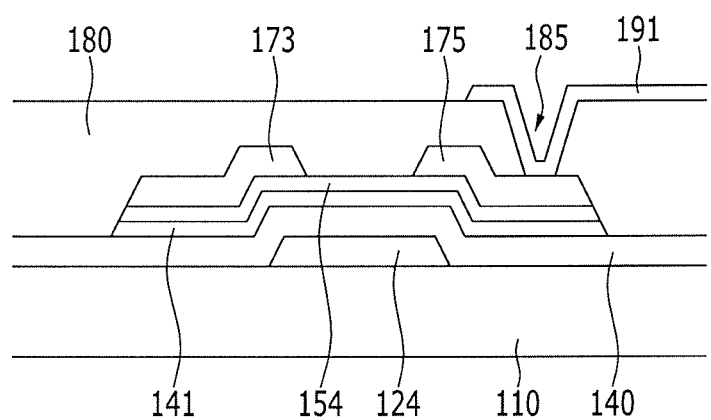
FIG. 4 is a cross-sectional view schematically illustrating a thin film transistor array panel having a top gate structure according to an exemplary embodiment of the present invention.
Figure 5:
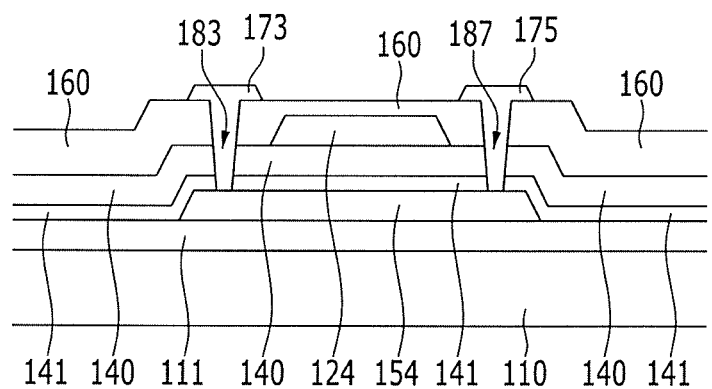
FIG. 5 is a cross-sectional view illustrating a thin film transistor array panel according to an exemplary embodiment of present invention.

FIG. 4 is a cross-sectional view schematically illustrating a thin film transistor array panel having a top gate structure according to an exemplary embodiment of the present invention. FIG. 5 is a cross-sectional view of a thin film transistor array panel according to an exemplary embodiment of the present invention.

Referring to FIG. 4, a blocking layer 111 may be disposed on the insulation substrate 110. The blocking layer 111 may include a silicon oxide or a silicon nitride. The semiconductor layer 154 may be disposed on the blocking layer 111. The semiconductor layer 154 may include the p-type oxide semiconductor. The semiconductor layer 154 may include the tin oxide or the copper oxide.

The interface layer 141 may be disposed on the semiconductor layer 154. The thickness of the interface layer 141 may be in the range of about 0.1 nm to about 20 nm. The interface layer 141 may include the fluorinated silicon oxide.

The gate insulating layer 140 may be disposed on the interface layer 141. The gate insulating layer 140 may include a silicon oxide or a silicon nitride.

The gate electrode 124 may be disposed on the gate insulating layer 140.

An insulating layer 160 may be disposed on the gate electrode 124.

The interface layer 141, the gate insulating layer 140, and the insulating layer 160 may each have a first contact hole 183 and a second contact hole 187. The first contact hole 183 and the second contact hole 187 may each overlap part of the semiconductor layer 154.

The source electrode 173 and the drain electrode 175 may be disposed on each of the insulating layer 160, the source electrode 173, and the drain electrode 175. The source electrode 173 may be connected to the semiconductor layer 154, for example, through the first contact hole 183. The drain electrode 175 may be connected to the semiconductor layer 154, for example, through the second contact hole 187.

A pixel electrode may be connected to the drain electrode 175.

Referring to FIG. 4, in the thin film transistor array panel according to an exemplary embodiment of the present invention, the semiconductor layer 154 may include the p-type oxide semiconductor material, and the interface layer 141 may include the fluorinated silicon oxide. The interface layer 141 may be disposed between the semiconductor layer 154 and the gate insulating layer 140. Accordingly, fluorine included in the interface layer 141 may reduce the number of dangling bonds of the semiconductor layer 154. As a result, performance of the thin film transistor including the p-type oxide semiconductor may be increased.

Referring to FIGS. 1 to 4, the interface layer 141 may be disposed on substantially the entire region of the gate insulating layer 140; however, exemplary embodiments of the present invention are not limited thereof. For example, the interface layer 141 may be disposed at a region below the semiconductor layer 154.

Referring to FIG. 5, the interface layer 141 may be disposed at the region below the semiconductor layer 154. Further, the interface layer 141 might not be disposed at the partial region on the gate insulating layer 140.

Figure 6:
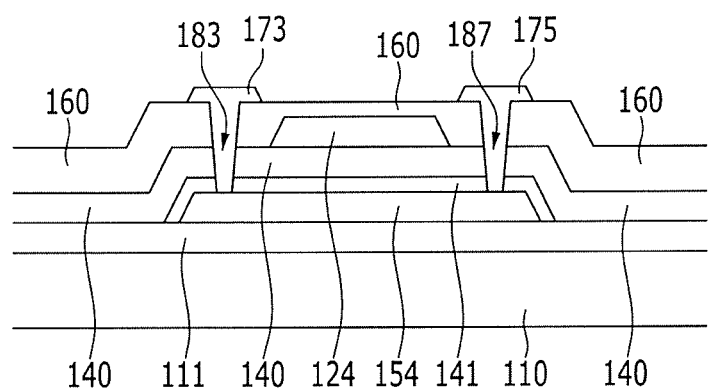
FIG. 6 is a cross-sectional view illustrating a thin film transistor array panel according to an exemplary embodiment of the present invention.

FIG. 6 is a cross-sectional view illustrating a thin film transistor array panel according to an exemplary embodiment of the present invention. Referring to FIG. 6, the interface layer 141 may be positioned at the region on the semiconductor layer 154. The partial region disposed below the gate insulating layer 140 might not be in contact with the interface layer 141.

The thin film transistor array panel according to an exemplary embodiment of the present invention will be described in more detail below with reference to Examples 1 to 3 and Embodiment 1.

The thin film transistor of the Embodiment 1 has a structure of FIG. 1. Various transistor characteristics were measured by differentiating materials of the interface layer. Property values of the transistor characteristics are shown in Table 1 and FIG. 7.

The semiconductor layer material may include $SnO_x$. The gate insulating layer material may include $SiO_2$.

The measured transistor characteristics are an $I_{ON/OFF}$ ratio, $I_{on}$, field effect mobility ($\mu_{FE}$), a threshold voltage ($V_{th}$), and subthreshold swing (SS).

TABLE 1

| Interface layer | Example 1 None; $SiO_2$ | Example 2 $SiN_y$ | Example 3 $Al_2O_3$ | Embodiment 1 SiOx:F |
|---|---|---|---|---|
| I ON/OFF ratio | $1.8 \times 10^3$ | 7.9 | $8.1 \times 10^2$ | $1.6 \times 10^3$ |
| $I_{ON}$ (A) | $1.6 \times 10^{-4}$ | $1.9 \times 10^{-4}$ | $1.4 \times 10^{-4}$ | $1.1 \times 10^{-4}$ |
| $\mu_{PE}$ (cm$^2$V$^{-1}$s$^{-1}$) | 2.8 | 2.1 | 2.5 | 3.1 |
| $V_{th}$ (V) | 19.0 | over 40.0 | 21.5 | 2.0 |
| SS (V/dec) | 6.9 | 29.9 | 10.2 | 5.4 |

Figure 7:
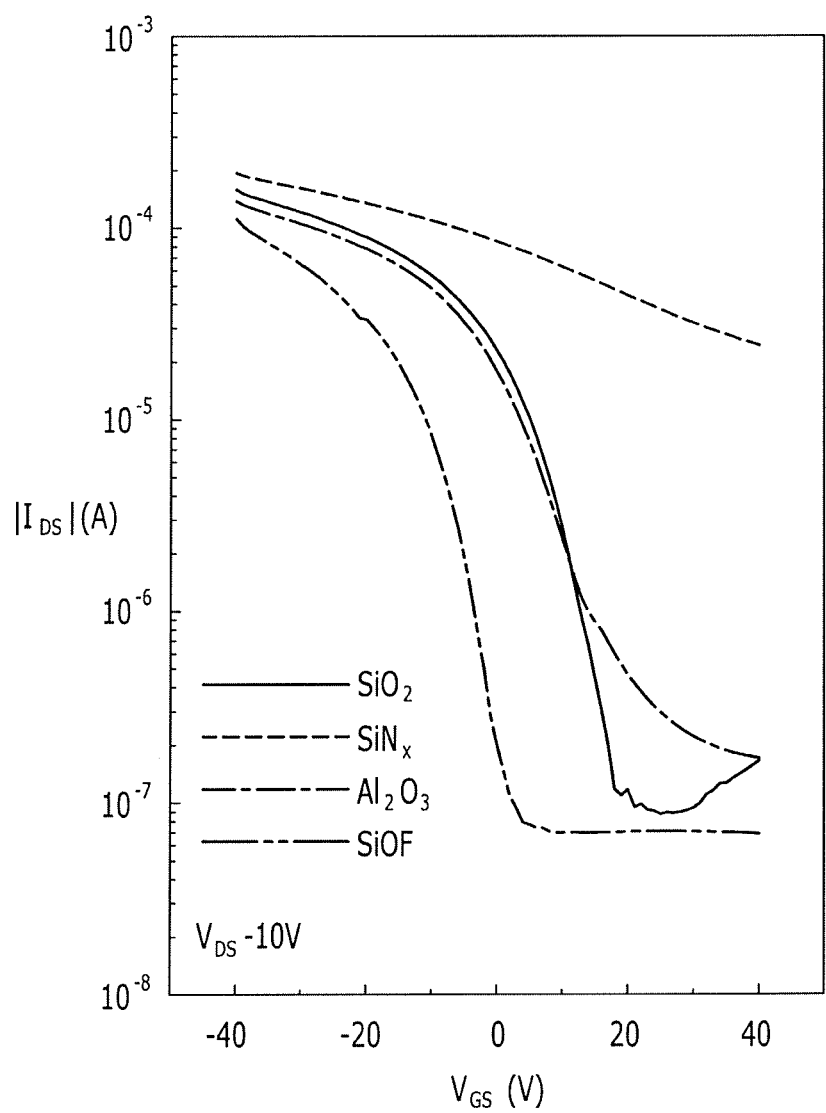
FIG. 7 is a graph measuring a characteristic of a thin film transistor while differentiating a material of an interface layer according to an exemplary embodiment of the present invention.

Property values of the transistor characteristics are also shown in FIG. 7.

Referring Table 1 and FIG. 7, when the interface layer includes SiOx:F as in Embodiment 1, the $I_{ON/OFF}$ value may be increased compared to Example 2 including $SiN_y$ as the interface layer and Example 3 including $Al_2O_3$ as the interface layer. Accordingly, the subthreshold swing SS value of Embodiment 1 may be decreased. As a result, thin film transistor characteristics of the thin film transistor including SiOx:F as the interface layer are increased.

The thin film transistor including SiOx:F as the interface layer of Embodiment 1 may have similar thin film transistor characteristics to the thin film transistor omitting the interface layer of Example 1. However, the threshold voltage value of Embodiment 1 may decrease to about a 1/10 level in comparison with the thin film transistor of Example 1. Accordingly, the driving voltage and the power consumption of the thin film transistor of Embodiment 1 may be reduced. Fluorine included in the SiOx:F may remove dangling bonds of the semiconductor layer.

The thin film transistor array panel according to an exemplary embodiment of the present invention may include the p-type oxide semiconductor material as the semiconductor layer 154. The thin film transistor array panel may also include the interface layer 141 including the fluorinated silicon oxide. The interface layer 141 may be disposed between the semiconductor layer 154 and the gate insulating layer 140. The thin film transistor array panel according to an exemplary embodiment of the present invention may increase the transistor performance of the thin film transistor including the p-type oxide semiconductor. Furthermore, the driving voltage may decrease by the reduction of the threshold voltage. As a result, the power consumption of the thin film transistor array panel may be reduced.

While exemplary embodiments of the present invention have been described herein, it is to be understood that the present invention is not limited thereto, but, on the contrary, is intended to cover various modifications and equivalent arrangements included within the spirit and scope of the present invention.

What is claimed is:

1. A thin film transistor array panel, comprising:
   a substrate;
   a gate insulating layer disposed on the substrate;
   an interface layer disposed on the gate insulating layer; and
   a semiconductor layer disposed on the interface layer,
   wherein the interface layer includes a fluorinated silicon oxide,
   wherein the semiconductor layer includes a p-type oxide semiconductor material,
   wherein an entirety of the interface layer is disposed between the semiconductor layer and the gate insulating layer,
   wherein a top surface and two opposing outer edge side surfaces of the semiconductor layer make direct contact with the interface layer,
   wherein the gate insulating layer includes a silicon oxide or a silicon nitride, and
   wherein the p-type oxide semiconductor material includes a tin oxide or a copper oxide.

2. The thin film transistor array panel of claim 1, wherein the semiconductor layer includes a tin oxide, and a threshold voltage of a thin film transistor of the thin film transistor array panel is about 3 V or less.

3. The thin film transistor array panel of claim 1, wherein the semiconductor layer includes a tin oxide, and a subthreshold swing value of a thin film transistor of the thin film transistor array panel is about 6 V/dec or less.

4. The thin film transistor array panel of claim 1, further comprising a gate electrode disposed between the substrate and the gate insulating layer.

5. The thin film transistor array panel of claim 1, further comprising a source electrode and a drain electrode disposed on the semiconductor layer.

6. The thin film transistor array panel of claim 5, further comprising a pixel electrode connected to the drain electrode.

7. The thin film transistor array panel of claim 1, wherein a thickness of the interface layer is in a range of about 0.1 nm to about 20 nm.

8. A thin film transistor array panel, comprising:
   a substrate;
   a semiconductor layer disposed on the substrate;
   an interface layer disposed on the semiconductor layer; and
   a gate insulating layer disposed on the interface layer,
   wherein the interface layer includes a fluorinated silicon oxide, wherein the semiconductor layer includes a p-type oxide semiconductor material, wherein an entirety of the interface layer is disposed between the semiconductor layer and gate insulating layer, wherein a top surface and two opposing outer edge side surfaces of the semiconductor layer make direct contact with the interface layer, wherein the gate insulating layer includes a silicon oxide or a silicon nitride, and wherein the p-type oxide semiconductor material includes a tin oxide or a copper oxide.

9. The thin film transistor array panel of claim 8, wherein the semiconductor layer includes a tin oxide, and a threshold voltage of a thin film transistor of the thin film transistor array panel is about 3 V or less.

10. The thin film transistor array panel of claim 8, wherein the semiconductor layer includes a tin oxide, and a sub-threshold swing value of a thin film transistor of the thin film transistor array panel is about 6 V/dec or less.

11. The thin film transistor array panel of claim 8, further comprising a gate electrode disposed on the gate insulating layer.

12. The thin film transistor array panel of claim 11, further comprising an insulating layer disposed on the gate electrode.

13. The thin film transistor array panel of claim 12, further comprising a source electrode and a drain electrode disposed on the insulating layer.

* * * * *